(12) United States Patent
Sanada

(10) Patent No.: US 7,872,329 B2
(45) Date of Patent: Jan. 18, 2011

(54) SEMICONDUCTOR DEVICE AND METHOD OF MANUFACTURING THE SAME

(75) Inventor: Kazuhiko Sanada, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 325 days.

(21) Appl. No.: 12/175,725

(22) Filed: Jul. 18, 2008

(65) Prior Publication Data

US 2009/0039466 A1     Feb. 12, 2009

(30) Foreign Application Priority Data

Aug. 9, 2007     (JP)     ............... 2007-208371

(51) Int. Cl.
*H01L 29/00*     (2006.01)
(52) U.S. Cl. ............... 257/534; 257/516; 257/301; 257/305; 257/E27.016; 438/386; 438/427
(58) Field of Classification Search ............... 257/534, 257/516, 301, 305, E27.016; 438/386, 427
See application file for complete search history.

(56) References Cited

U.S. PATENT DOCUMENTS 6,373,087 B1     4/2002     Harris et al.

6,919,246 B2 *   7/2005   Park .......................... 438/243
7,566,932 B2 *   7/2009   Huang et al. ................ 257/330

FOREIGN PATENT DOCUMENTS

| JP | 60-148164 A   | 8/1985  |
| JP | 2000-332101 A | 11/2000 |
| JP | 2005-353657 A | 12/2005 |

* cited by examiner

*Primary Examiner*—Tu-Tu V Ho
(74) *Attorney, Agent, or Firm*—Sughrue Mion, PLLC

(57) ABSTRACT

Effective area of a capacitor is to be increased while suppressing increase in number of manufacturing steps. In a semiconductor device, a silicon substrate includes a plurality of first recessed portions having a first depth from the main surface thereof, a second recessed portion provided in a region other than the first recessed portion and having a second depth from the main surface, and a third recessed portion provided in at least one of the plurality of first recessed portions and having a third depth from the bottom portion of the first recessed portion. The second recessed portion and the third recessed portion have the same depth, and a decoupling condenser is provided so as to fill the at least one of the first recessed portion and the third recessed portion provided therein, and an isolation insulating layer is provided so as to fill the remaining first recessed portions, and the second recessed portion is filled with a gate electrode.

12 Claims, 10 Drawing Sheets

SEMICONDUCTOR DEVICE AND METHOD OF MANUFACTURING THE SAME

This application is based on Japanese patent application No. 2007-208371, the content of which is incorporated hereinto by reference.

BACKGROUND

1. Technical Field

The present invention relates to a semiconductor device, and to a method of manufacturing the same.

2. Related Art

A capacitor is one of fundamental devices, and employed in a versatile manner as a decoupling condenser or a booster circuit. Essential characteristics of the capacitor include the capacitance per unit area. This is because a larger capacitance per unit area of the capacitor allows reducing the area necessary for acquiring the desired capacitance. In particular, the decoupling condenser for stabilizing a source voltage requires a large footprint, and hence increasing the capacitance per unit area of the capacitor effectively contributes to reducing the area of the chip.

FIG. 9 is a cross-sectional view of a gate capacitor, popularly utilized as the capacitor. The gate capacitor shown in FIG. 9 includes a substrate 201, an insulating layer 202 provided thereon, and a conductive layer 203 provided on the insulating layer 202.

A technique for improving the gate capacitance can be found, for example, in JP-A No. 2005-353657.

FIG. 10 depicts a structure of a semiconductor chip described in the cited literature. The device shown in FIG. 10 includes a substrate 301, an isolation region including a first trench 302a formed on the substrate and insulating layers 303, 304 buried in the first trench, and a capacitance region having a lower electrode constituted of a second trench 302b formed on the substrate except for the isolation region and a diffusion layer 305 formed on a region including the second trench 302b. In such structure, the inner portion of the second trench 302b can serve as a part of the effective area of the capacitor formed in the capacitance region. Such configuration enables significantly reducing the footprint of the capacitor on the substrate, without compromise in amount of capacitance. Consequently, a higher level of integration and chip density of the semiconductor device can be achieved.

In addition, JP-A No. 2000-332101 discloses a structure in which a trench including a single segment and a trench including a plurality of continuous segments are provided in a substrate.

JP-A No. S60-148164 discloses a structure including an isolation trench and memory capacitors provided on the respective sides thereof, in which trenches are formed in different depths in the substrate.

JP-A No. H01-119055 discloses a method of forming a capacitor, including forming a gate electrode on a sidewall of a recessed portion of a substrate, removing a gate insulating layer on a bottom portion of the recessed portion, selectively removing the substrate so as to form a recessed portion, and forming the capacitor so as to fill the recessed portion.

[Patent document 1] JP-A No. 2005-353657
[Patent document 2] JP-A No. 2000-332101
[Patent document 3] JP-A No. S60-148164
[Patent document 4] JP-A No. H01-119055

In the gate capacitor shown in FIG. 9, the surface area of the capacitance per unit area on the main surface of the substrate, in other words the capacitance per two-dimensional unit area, is unchanged once the capacitance layer thickness is uniquely determined. On the other hand, in the gate capacitor according to the patented document 1, the effective capacitance per two-dimensional unit area is increased utilizing the sidewall of the trench.

The technique according to the patented document 1, however, still has a room for improvement in that the effective area of the capacitor is to be increased with a minimal increase in number of manufacturing steps.

SUMMARY

In one embodiment, there is provided a semiconductor device, comprising:
a substrate;
a capacitor and an isolation insulating layer provided in the vicinity of a surface of the substrate;
wherein the substrate includes:
a plurality of first recessed portions provided on a main surface of the substrate;
a second recessed portion provided on the main surface of the substrate in a region other than where the first recessed portions are provided; and
a third recessed portion provided on a bottom portion of at least one of the plurality of first recessed portions;
the second recessed portion and the third recessed portion have generally the same depth;
the capacitor is provided over a region including at least one of the first recessed portions and the third recessed portion provided therein, and the isolation insulating layer is provided so as to fill the remaining first recessed portions; and
the second recessed portion is filled with at least a portion of a gate electrode.

In another embodiment, there is provided a method of manufacturing a semiconductor device, comprising:
selectively removing a substrate and forming a plurality of first recessed portions on a main surface of the substrate;
burying an insulating layer in the plurality of first recessed portions;
removing the insulating layer from at least one of the plurality of first recessed portions, so as to expose an inner wall thereof;
selectively removing the substrate in the at least one of the plurality of first recessed portions so as to form a third recessed portion, and selectively removing the substrate in a region other than where the first recessed portions are provided, so as to form a second recessed portion on the main surface, in generally the same depth as the third recessed portion;
forming a capacitance insulating layer so as to cover the inner wall of the at least one of the first recessed portions and an inner wall of the third recessed portion, and forming a gate insulating layer so as to cover an inner wall of the second recessed portion; and
forming an upper electrode in the at least one of the first recessed portions and the third recessed portion, so as to cover the capacitance insulating layer and to fill the at least one of the first recessed portions and the third recessed portion, and forming a gate electrode on the gate insulating layer, so as to fill the second recessed portion.

In the semiconductor device thus constructed, the third recessed portion is further provided in the recessed portion of the same depth as the first recessed portion serving as the isolation region, and a decoupling condenser is provided in the first recessed portion including the third recessed portion. Further, the second recessed portion of the same depth as the third recessed portion is provided on the main surface of the substrate, and the gate electrode is buried in the second recessed portion. Since the recessed portion in which the decoupling condenser is provided includes the first and the third recessed portion, the effective area of the decoupling condenser per unit area on the main surface can be increased. From the viewpoint of the manufacturing process, the first recessed portion serving as the isolation region and the first recessed portion in which the decoupling condenser is provided can be formed through the same process at a time. Also, the third recessed portion can be formed in the first recessed portion in the same step as forming the second recessed portion, in the formation process of the gate electrode. Thus, the present invention enables increasing the effective area of the decoupling condenser, without increasing the number of manufacturing steps.

In the present invention, the capacitor may be either a decoupling condenser, or a boost/buck capacitor.

In still another embodiment, there is provided a semiconductor device comprising:

a first recessed portion opened on a substrate;

a second recessed portion formed outside the first recessed portion;

a third recessed portion opened inside the first recessed portion;

a capacitance insulating layer provided so as to cover the first and the third recessed portion;

an upper electrode formed on the capacitance insulating layer;

an insulating layer provided so as to cover the second recessed portion; and a gate electrode formed on the insulating layer so as to cover the second recessed portion;

wherein the second recessed portion and the third recessed portion have generally the same bore and depth; and the capacitance insulating layer and the upper electrode constitute a capacitor, with the substrate serving as a lower electrode.

The semiconductor device thus constructed may further include a fourth recessed portion of the same depth as the first recessed portion serving as the isolation region. Also, the first recessed portions may be located at a predetermined interval in a region between the isolation regions. Such structure prevents a damage from dishing in a chemical mechanical polishing (hereinafter, CMP) process. Further, a plurality of third recessed portions may be provided in the first recessed portion.

The present invention enables increasing the effective area of the decoupling condenser, while suppressing an increase in number of manufacturing steps.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The present invention will be now described herein with reference to illustrative embodiments. Those skilled in the art will recognize that many alternative embodiments can be accomplished using the teachings of the present invention and that the invention is not limited to the embodiments illustrated for explanatory purposed.

Hereunder, exemplary embodiments of a semiconductor device and a method of manufacturing the same according to the present invention will be described, referring to the accompanying drawings. In all the drawings, the same constituents will be given the same numeral, and the description thereof will not be repeated.

First Embodiment

Figure 1:
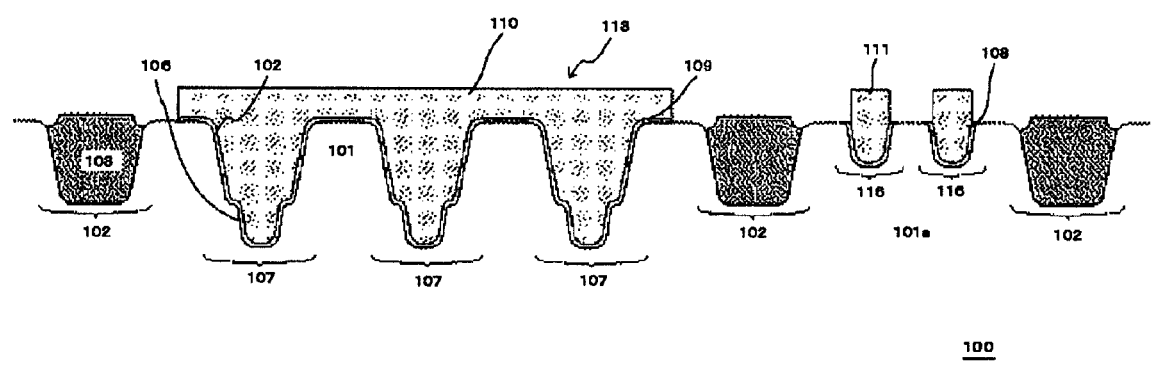
FIG. 1 is a cross-sectional view showing a structure of a semiconductor device according to an embodiment.

FIG. 1 is a cross-sectional view showing a structure of a semiconductor device according to this embodiment this embodiment. The shown in FIG. 1 includes an isolation region, a decoupling condenser and a transistor of a recessed gate structure, provided on a substrate (silicon substrate 101). To be more detailed, the semiconductor device 100 includes a first recessed portion 102 opened on the substrate (silicon substrate 101), a second recessed portion 116 formed outside the first recessed portion 102, a third recessed portions 106 opened in the first recessed portion 102, a capacitance insulating layer 109 formed so as to cover the first and the third recessed portion, an upper electrode 110 formed on the capacitance insulating layer 109, a gate insulating layer 108 formed so as to cover the second recessed portion 116, and a gate electrode 111 formed on the gate insulating layer 108 so as to cover the second recessed portion 116. The second recessed portion 116 and the third recessed portion 106 have generally the same bore and depth, and the capacitance insulating layer 109 and the upper electrode 110 constitute the decoupling condenser, with the silicon substrate 101 serving as the lower electrode. In this embodiment, the capacitor is exemplified by the decoupling condenser, however actually the capacitor may be the one employed in a booster circuit or the like, without limitation to the decoupling condenser. Also, the semiconductor device 100 may further include a fourth recessed portion (not shown) of the same depth as the first recessed portion 102, which is to serve as an isolation region. Further, it is preferable to locate a plurality of first recessed portions 102 at a predetermined interval, in a region between the isolation trench (fourth recessed portion). Such structure effectively prevents a damage from dishing because of the CMP process for forming the isolation layer.

The foregoing constituents will be further described hereunder. Provided on the silicon substrate 101 are the plurality of first recessed portions 102 having a first depth from the main surface thereof, the second recessed portion 116 provided in a region other than the first recessed portion 102 and having a second depth from the main surface, and the third recessed portion 106 provided in at least one of the plurality of first recessed portions 102 and having a third depth from the bottom portion of the first recessed portion 102. It should be noted here that the depth of the third recessed portion 106 refers to the depth from the bottom portion of the first recessed portion 102.

Over a region including the at least one of the first recessed portions 102 and the third recessed portion 106 provided therein the decoupling condenser 113 is provided, and an isolation insulating layer 103 is provided so as to fill the remaining first recessed portions 102.

Regarding the depth of the recessed portion formed on the silicon substrate 101, the second recessed portion 116 and the third recessed portion 106 have the same depth. According to FIG. 1, the depth of all the plurality of first recessed portions 102 is the same. Likewise, the depth of all the plurality of second recessed portions 116 is the same, and that of all the plurality of third recessed portions 106 is the same. Further, as shown in FIG. 1, the third recessed portion 106 and the second recessed portion 116 have the same bore.

Here, "the same depth/bore" of the recessed portions means an approximation that can be reasonably achieved upon forming the recessed portions through the same process with a mask of the same size and pattern, and fluctuation of a normal extent from the manufacturing condition is permissible.

The decoupling condenser 113 is constituted of the silicon substrate 101, the upper electrode 110 provided so as to fill the at least one of the first recessed portions 102 and the third recessed portion 106 provided therein, and the capacitance insulating layer 109 provided between the first recessed portion 102 and the third recessed portion 106, and the upper electrode 110.

In the transistor region 101a, the gate insulating layer 108 covers the entire inner wall of the second recessed portion 116 formed on the silicon substrate 101. On the gate insulating layer 108, the gate electrode 111 is provided so as to fill the second recessed portion 116. The upper electrode 110 and the gate electrode 111 are constituted of the same material.

In FIG. 1, a plurality of recessed portions 107, including one each of the first recessed portion 102 and the third recessed portion 106, is provided on the silicon substrate 101. Also, a plurality of recessed portions 107 is disposed in a plane, and the capacitance insulating layer 109 and the upper electrode 110 are provided in common to the a plurality of first recessed portions 102. In other words, the capacitance insulating layer 109 and the upper electrode 110 cover the entire sidewall of the recessed portion 107, as well as the surface of the silicon substrate 101 in a region between the recessed portions 107.

A method of manufacturing the semiconductor device 100 will now be described hereunder. The manufacturing process of the semiconductor device 100 includes the following steps.

Selectively removing the silicon substrate 101 and forming the plurality of first recessed portions 102 on the main surface of the silicon substrate 101. Burying the insulating layer (isolation insulating layer 103) in the plurality of first recessed portions 102.

Removing the isolation insulating layer 103 from at least one of the plurality of first recessed portions 102, so as to expose an inner wall of the recessed portion. Selectively removing the silicon substrate 101 in the at least one of the plurality of first recessed portions 102 so as to form the third recessed portion 106, and selectively removing the silicon substrate 101 in a region other than where the first recessed portions 102 are provided, so as to form a second recessed portion 116 on the main surface, in the same depth as the third recessed portion 106.

Forming the capacitance insulating layer 109 so as to cover the inner wall of the at least one of the first recessed portions 102 and the inner wall of the third recessed portion 106, and forming the gate insulating layer 108 so as to cover the inner wall of the second recessed portion 116.

Forming the upper electrode 110 in the at least one of the first recessed portions 102 and the third recessed portion 106, so as to cover the capacitance insulating layer 109 and to fill the at least one of the first recessed portions 102 and the third recessed portion 106, and forming the gate electrode 111 on the gate insulating layer 108, so as to fill the second recessed portion 116.

Referring to FIGS. 2 to 4B, the respective steps will be described in details. FIGS. 2 to 4B are cross-sectional views for explaining a manufacturing process of the semiconductor device 100 shown in FIG. 1.

Figure 2:
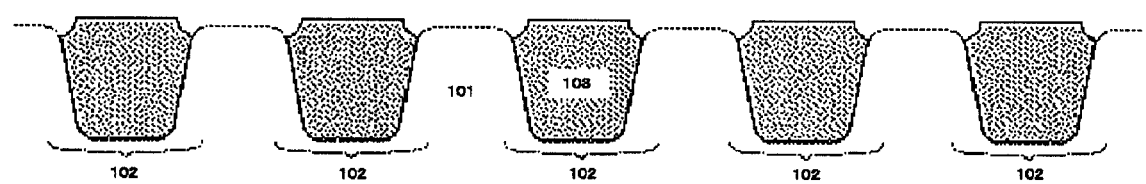
FIG. 2 is a cross-sectional view for explaining a manufacturing process of the semiconductor device shown in FIG. 1.

Referring first to FIG. 2, a plurality of isolation regions is formed on the main surface of the silicon substrate 101, through a known shallow trench isolation (hereinafter, STI) technique. To be more detailed, the silicon substrate 101 is selectively removed by etching, to thereby form the plurality of first recessed portions 102. The first recessed portions 102 are formed in the same depth and bore, because a mask pattern of the same shape and size is employed. The insulating layer, for example a silicon oxide layer, is formed so as to fill the first recessed portions 102, and a CMP process is performed so as to remove the insulating layer formed outside the first recessed portion 102. At this stager the isolation insulating layer 103 filling in the first recessed portion 102 is obtained.

Figure 3A:
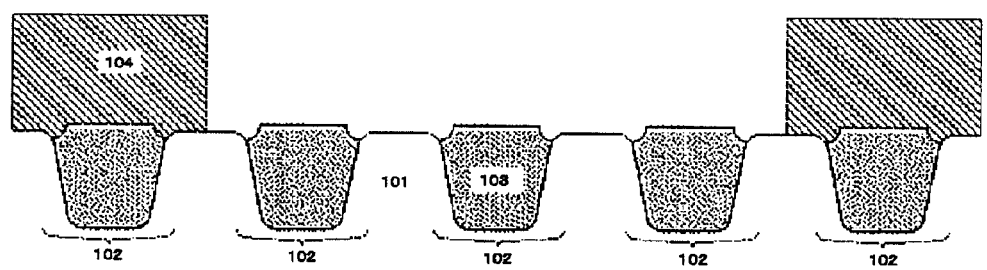
FIGS. 3A and 3B are cross-sectional views for explaining a manufacturing process of the semiconductor device shown in FIG. 1.

Referring now to FIG. 3A, a resist pattern 104 of a shape that covers at least one of the plurality of first recessed portions 102 is formed on the silicon substrate 101. To form the resist pattern 104, a known lithography process may be employed.

The resist pattern 104 shown in FIG. 3A has such a shape that an opening is provided above the adjacent plurality of first recessed portions 102.

Figure 3B:
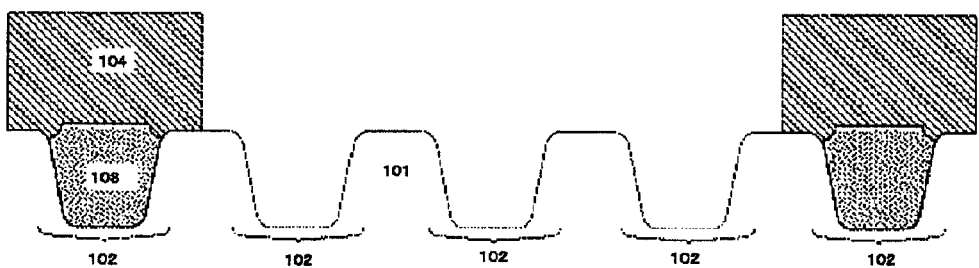

Then a portion of the isolation insulating layer 103 buried inside the first recessed portions 102 which are not covered with the resist pattern 104 is selectively removed, so as to form the first recessed portion 102 not filled with the isolation insulating layer 103 (FIG. 3B).

To remove the isolation insulating layer 103, a known dry etching or wet etching process, or a combination thereof, may be employed.

Referring to FIG. 3B, the isolation insulating layer 103 is completely removed from the first recessed portion 102 not covered with the resist pattern 104, to thereby expose the entire inner wall of the first recessed portion 102.

Figure 4A:
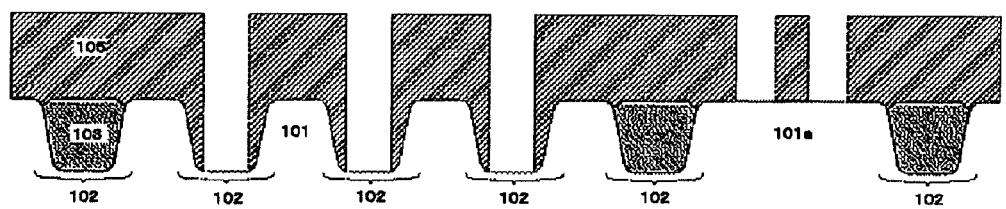
FIGS. 4A and 4B are cross-sectional views for explaining a manufacturing process of the semiconductor device shown in FIG. 1.

Then a known lithography process is performed so as to form a resist pattern 105 for patterning the second recessed portion 116 (recessed gate trench) on the transistor region 101a of the silicon substrate 101. At this step, the resist pattern 105 is formed such that an opening is also formed on the bottom portion of those first recessed portions 102 which are not filled with the isolation insulating layer 103 (FIG. 4A).

Figure 4B:
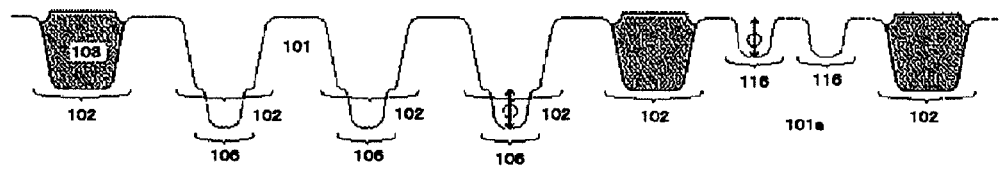

Then a known dry etching or wet etching process, or a combination thereof, is performed so as to form the second recessed portion 116, as well as the third recessed portion 106 on the bottom portion of the first recessed portion 102 at a time (FIG. 4B). Here, from the viewpoint of the efficiency of the lithography process, it is preferable that the openings on the mask corresponding to the respective recessed portions are formed in the same width (for trenches) and diameter (for holes), when forming the second recessed portion 116 and the third recessed portion 106 by etching. As a result, the second recessed portion 116 and the third recessed portion 106 are formed as recessed portions of the same depth, and the same width or bore.

Then a mask is utilized to form the gate insulating layer 108 and the capacitance insulating layer 109, on the second recessed portion 116, and on the recessed portion 107 including the first recessed portion 102 and the third recessed portion 106 and the region between the adjacent recessed portions 107, respectively.

The mask has openings at positions corresponding to the recessed portion 107, the region between the adjacent recessed portions 107, and the second recessed portion 116.

The capacitance insulating layer 109 covers the entire inner wall of the recessed portion 107, and the surface of the silicon substrate 101 between the recessed portions 107. Accordingly, the capacitance insulating layer 109 is formed so as to extend from the sidewall of the first recessed portion 102 to the bottom portion of the third recessed portion 106. Further, on the gate insulating layer 108 and the capacitance insulating layer 109, the gate electrode 111 and the upper electrode 110 are respectively formed. As a result, the gate electrode 111 and the decoupling condenser 113 are formed at a time.

It is to be noted that the gate insulating layer 108 and the capacitance insulating layer 109 are constituted of the same material, for example a silicon oxide layer. The upper electrode 110 and the gate electrode 111 are constituted of the same material, for example a polycrystalline silicon layer. Also, before forming the capacitance insulating layer 109, a predetermined impurity may be selectively implanted on the region where the decoupling condenser 113 is to be formed, to thereby form a diffusion layer.

Through the foregoing process, the semiconductor device 100 shown in FIG. 1 is obtained as a fundamental structure of a capacitor. This is followed by formation of a structure that serves for electrical connection to the silicon substrate 101 and the upper electrode 110 (for example, a connection plug) is formed through a known technique, so that the electrically operative decoupling condenser 113 is obtained.

The foregoing embodiment offers the following advantageous effects.

In this embodiment, the third recessed portion 106 is further provided on the bottom portion of the first recessed portion 102 located in the region where the decoupling condenser 113 is to be formed, and the third recessed portion 106 has the same depth as the second recessed portion 116 which is the recessed portion for the gate electrode 111. Also, the first recessed portion 102 formed on the silicon substrate 101 in the region where the decoupling condenser 113 is to be formed has the same depth as the first recessed portion 102 serving as the isolation region. Such structure allows effectively increasing the surface area of the decoupling condenser 113 per unit area of the region occupied by the decoupling condenser 113. Further forming the recessed gate trench inside the trench of the isolation region leads to an increase in effective area of the capacitor, with the addition of the sidewall component and the bottom portion component. In this embodiment, further, a recessed gate formation process is applied when forming the third recessed portion 106 by etching, which eliminates the need to perform an additional step for forming the decoupling condenser 113.

Thus, according to this embodiment, the decoupling condenser 113 can be formed without incurring an increase in number of manufacturing steps, and besides the surface area of the decoupling condenser 113 thus obtained can be increased. The foregoing process also allows increasing the surface area of the decoupling condenser 113 without increasing the size of the chip thereby effectively suppressing a noise of the silicon substrate 101, as well as field concentration at an end portion of the gate electrode 111 because of the recessed gate structure, thus achieving a small-sized yet reliable device. Further, the capacitance per unit area (chip area) of the capacitor can be increased, which enables reducing the chip area, thus reducing the cost of the device.

Meanwhile, in the device according to the patented document 1 described referring to the related art, the effective area of the capacitor portion only includes the isolation trench. According to the foregoing embodiment, in contrast, the recessed gate structure is employed in the transistor region of the semiconductor device, and the recessed portion (third recessed portion 106) of the same depth as the recessed gate trench is further provided inside the recessed portion (first recessed portion 102) formed together with the isolation trench, which leads to a further increase in effective area of the decoupling condenser 113. Consequently, the capacitance per unit area of the decoupling condenser 113 can be further increased, so that sufficient capacitance can be secured with a smaller footprint.

The increase in surface area of the decoupling condenser 113 in comparison with the patented document 1 will be indicated through specific examples.

Figure 10:
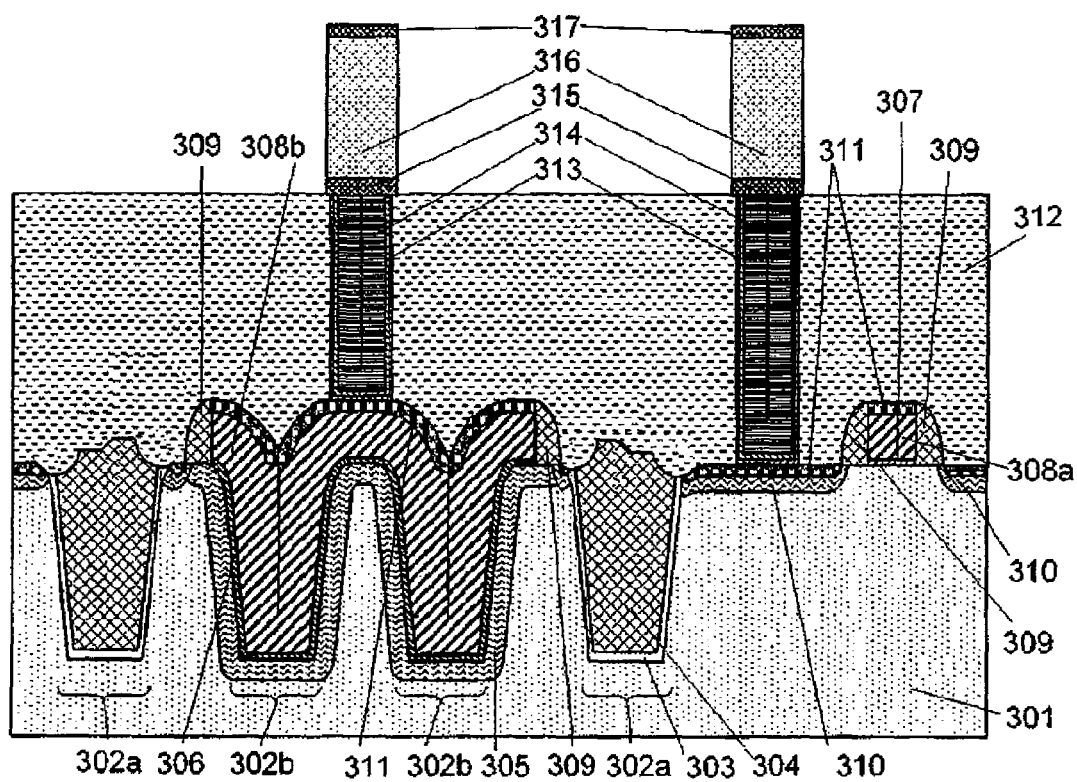
FIG. 10 is a cross-sectional view showing a structure of another conventional semiconductor device.

With the structure according to the patented document 1 shown in FIG. 10, and on the assumption that the trench 302b is 200 nm in depth and 300 nm in width, rough estimation of the effective area may be made as follows:

$$300 \times 300 \text{ (bottom component)} + 200 \times 300 \times 4 \text{ (sidewall component)} = 330000 \text{ nm}^2$$

On the other hand, rough estimation of the effective area according to this embodiment may be made as follows. For example, it will be assumed that the first recessed portion 102 is 200 nm in depth and 300 nm in width, and that the second recessed portion 116 and the third recessed portion 106 are 100 nm in depth and 100 nm in width.

$$330000 + 100 \times 100 \times 4 \text{ (sidewall component of third recessed portion 106 and second recessed portion 116)} = 370000 \text{ nm}^2$$

Although actually the capacitance may fluctuate depending on the inclination of the recessed portion and other factors, the structure according to this embodiment achieves an increase in effective area of approx. 9%.

Figure 5:
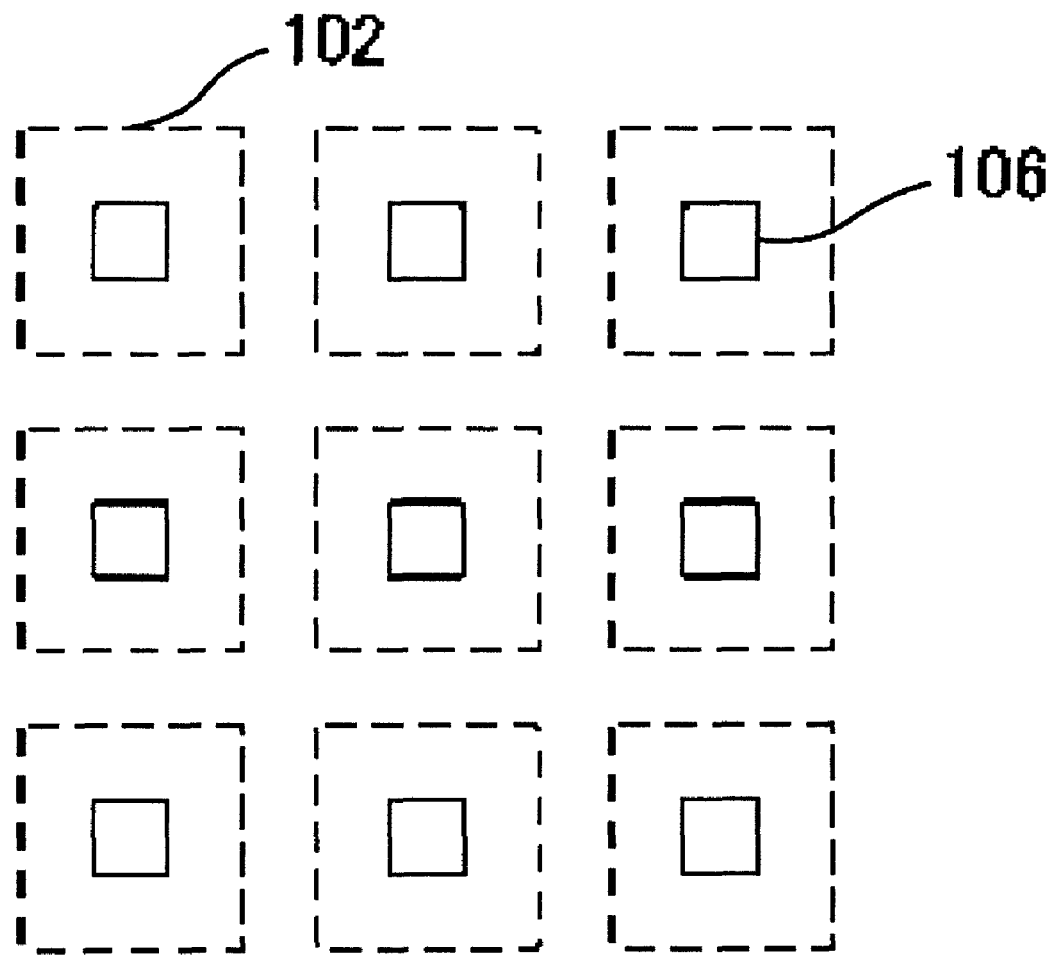
FIG. 5 is a schematic plan view showing the semiconductor device shown in FIG. 1.

FIG. 5 is a schematic plan view of the semiconductor device 100, which depicts a plan-view layout of the decoupling condenser 113. In FIG. 5, the first recessed portions 102 including the third recessed portion 106 are arranged in a square grid pattern on the main surface of the silicon substrate 101. Without limitation to this pattern, the first recessed portions 102 may be arranged in a diagonal grid pattern.

In this embodiment, a diffusion layer that serves as the lower electrode of the decoupling condenser 113 is included between the isolation regions (not shown). Therefore, appropriately designing the width and pitch of the first recessed portion 102 allows adjusting the data rate of the diffusion layer and the gate. In the manufacturing process of the semiconductor device, usually a CMP process is performed for planarization of the STI and the gate layers, however in a large area region where an underlying pattern is absent in the CMP process, a dishing effect is prone to be incurred, such that excessive polishing is performed in comparison with the region where the pattern is present, which may degrade the flatness. The dishing effect often provokes short-circuit between patterns in the metal processing of the upper layers.

In this embodiment, appropriately arranging the decoupling condenser 113 as above allows giving the decoupling condenser 113 the function as a dummy pattern for the CMP process. To be more detailed, a rectangular-shaped diffusion layer and a gate pattern that are electrically inoperative may be located in a large-area region where the pattern is not provided, so as to employ as the CMP dummy pattern. Such arrangement enables designing the device so as to upgrade the uniformity of the CMP process, taking the data rate into consideration.

The semiconductor device 100 includes the dummy diffusion layer which is electrically inoperative, and has the diffusion layer pattern of the same plan-view layout as the pattern of the dummy diffusion layer. The semiconductor device 100 also includes a dummy gate which is electrically inoperative, and has a gate pattern of the same plan-view layout as the pattern of the dummy gate.

Hereinafter, differences from the foregoing embodiment will be focused on.

Second Embodiment

Figure 6:
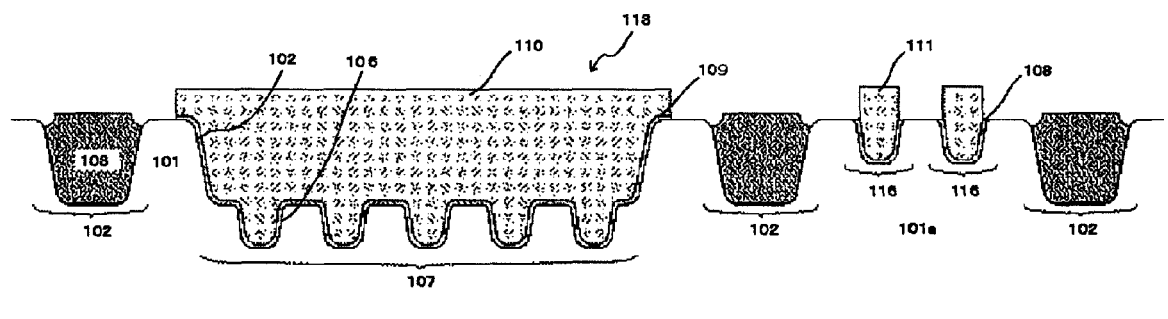
FIG. 6 is a cross-sectional view showing a structure of a semiconductor device according to another embodiment.

FIG. 6 is a cross-sectional view showing a structure of a semiconductor device according to a second embodiment. Although the basic structure of the semiconductor device 120 shown in FIG. 6 is similar to that of the semiconductor device 100 shown in FIG. 1, the configuration of the recessed portion 107 in the decoupling condenser 113 is different. Specifically, in the decoupling condenser 113 of the semiconductor device 120, one of the first recessed portions 102 includes a plurality of third recessed portions 106.

Figure 7A:
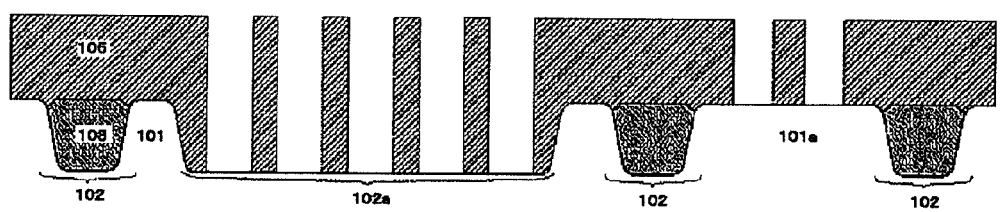
FIGS. 7A and 7B are cross-sectional views for explaining a manufacturing process of the semiconductor device shown in FIG. 6.
Figure 7B:
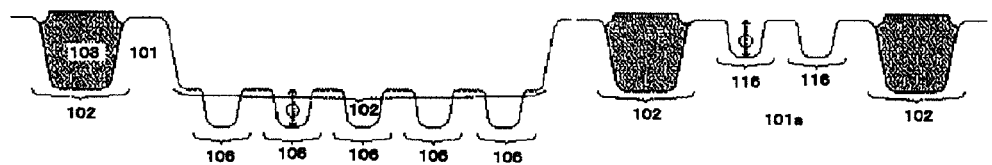

FIGS. 7A and 7B are cross-sectional views for explaining a manufacturing process of the semiconductor device shown in FIG. 6.

Firstly the process described referring to FIGS. 2 to 3B is performed so as to form the plurality of first recessed portions 102 on the silicon substrate 101, and the isolation insulating layer 103 is formed so as to fill the first recessed portions 102, but from at least one of the first recessed portions 102 the isolation insulating layer 103 once filled is removed. In this embodiment, all of the first recessed portions 102 are of the same depth, however the first recessed portions 102 where the decoupling condenser 113 is to be provided are formed with a larger bore than those which are to serve as the isolation region.

Referring now to FIG. 7A, a known lithography process is performed to form the resist pattern 105, for patterning the second recessed portion 116 (recessed gate trench) in the transistor region 101a of the silicon substrate 101. At the same time, a plurality of openings is formed on the bottom portion of the first recessed portion 102 that is not filled with the isolation insulating layer 103.

Then a known dry etching or wet etching process, or a combination thereof, is performed so as to form the second recessed portion 116 and the third recessed portion 106 at a time. Here, from the viewpoint of the efficiency of the lithography process, it is preferable that the openings on the mask corresponding to the respective recessed portions are formed in the same width (for trenches) and diameter (for holes), when forming the second recessed portion 116 and the third recessed portion 106 by etching. As a result, the second recessed portion 116 and the third recessed portion 106 are formed as recessed portions of the same depth, and the same width or bore.

Figure 8:
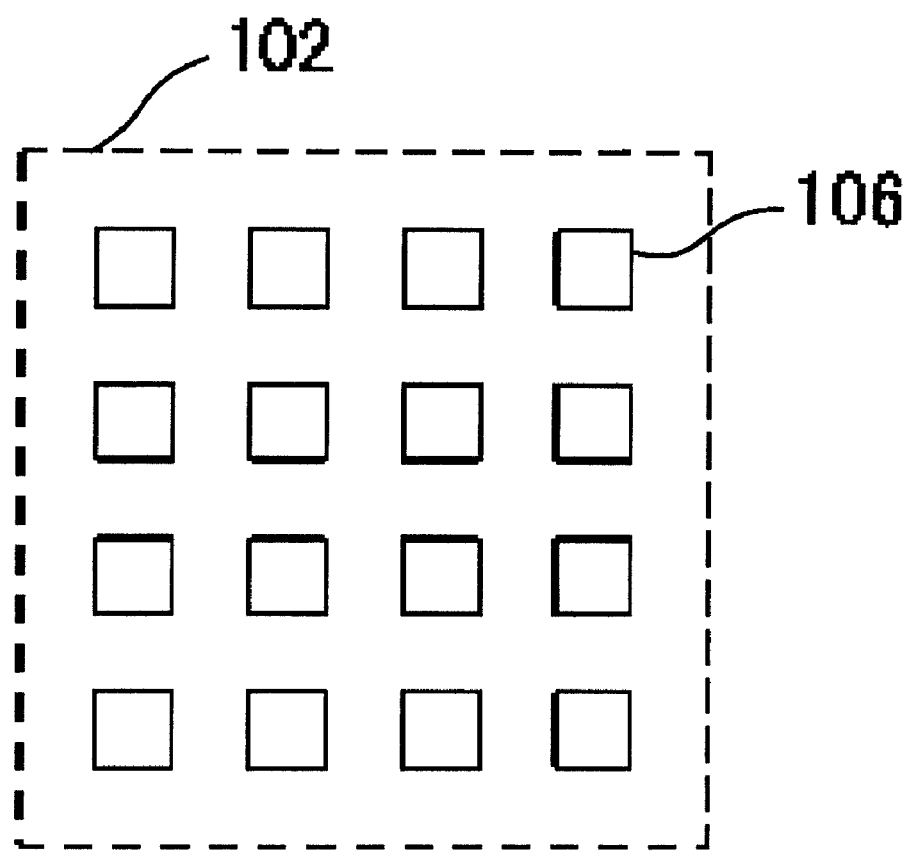
FIG. 8 is a schematic plan view showing the semiconductor device shown in FIG. 6.
Figure 9:
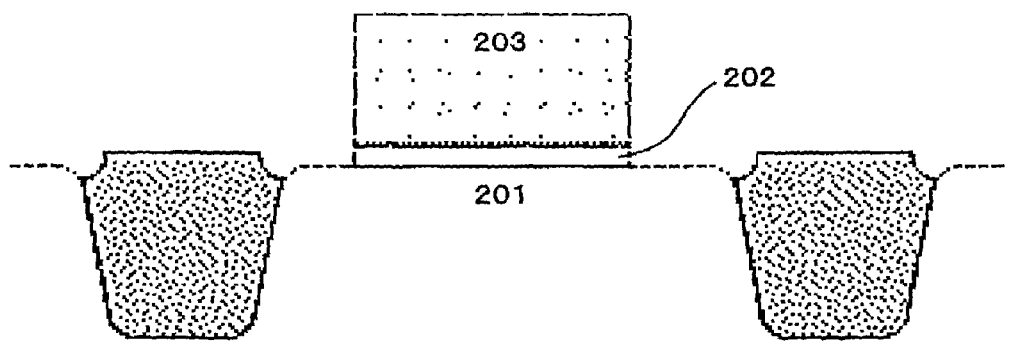
FIG. 9 is a cross-sectional view showing a structure of a conventional semiconductor device.

Thereafter, the process described in the foregoing embodiment is performed, to thereby fort the gate insulating layer 108 and the capacitance insulating layer 109, followed by the formation of the gate electrode 111 and the upper electrode 110. FIG. 8 is a schematic plan view of the semiconductor device 120 obtained in this embodiment, which depicts a plan-view layout of the decoupling condenser 113. In FIG. 8, a plurality of third recessed portions 106 is arranged in a square grid pattern in one of the first recessed portions 102.

This embodiment also offers the similar advantageous effects as those of the foregoing embodiment.

The embodiments of the present invention have been described as above, however it is to be understood that they are only exemplary, and that various other arrangements may be adopted.

For example, although the foregoing embodiments represent the case where the first recessed portion 102 and the third recessed portion 106 are of a bore shape, the recessed portions may be of a trench shape. In this case, for example, the third recessed portion 106 and the second recessed portion 116 may have the same width and depth, and the plurality of first recessed portions 102 may have the same width and depth.

It is apparent that the present invention is not limited to the above embodiment, and may be modified and changed without departing from the scope and spirit of the invention.

What is claimed is:

1. A semiconductor device, comprising:
a substrate;
a capacitor and an isolation insulating layer provided in the vicinity of a surface of said substrate;
wherein said substrate includes:
a plurality of first recessed portions provided on a main surface of said substrate;
a second recessed portion provided on said main surface of said substrate in a region other than where said first recessed portions are provided; and
a third recessed portion provided on a bottom portion of at least one of said plurality of first recessed portions;
said second recessed portion and said third recessed portion have generally the same depth;
said capacitor is provided over a region including at least one of said first recessed portions and said third recessed portion provided therein, and said isolation insulating layer is provided so as to fill the remaining first recessed portions; and
said second recessed portion is filled with at least a portion of a gate electrode.

2. The semiconductor device according to claim 1,
wherein said capacitor includes:
said substrate,
an upper electrode provided so as to fill said at least one of said first recessed portions and said third recessed portion provided therein, and
a capacitance insulating layer provided between said first and said third recessed portion and said upper electrode; and
said upper electrode and said gate electrode are constituted essentially of the same material.

3. The semiconductor device according to claim 1, wherein said third recessed portion and said second recessed portion are generally the same in at least one of width and bore.

4. The semiconductor device according to claim 3, wherein one of said first recessed portions includes a plurality of said third recessed portions.

5. The semiconductor device according to claim 3, wherein said substrate includes a plurality of recessed portions respectively including one each of said first recessed portion and said third recessed portion.

6. The semiconductor device according to claim 1, wherein said capacitor is a decoupling condenser.

7. The semiconductor device according to claim 1, wherein said capacitor is a boost/buck capacitor.

8. A method of manufacturing a semiconductor device, comprising:

selectively removing a substrate and forming a plurality of first recessed portions on a main surface of said substrate;

burying an insulating layer in said plurality of first recessed portions;

removing said insulating layer from at least one of said plurality of first recessed portions, so as to expose an inner wall thereof;

selectively removing said substrate in said at least one of said plurality of first recessed portions so as to form a third recessed portion, and selectively removing said substrate in a region other than where said first recessed portions are provided, so as to form a second recessed portion on said main surface, in generally the same depth as said third recessed portion;

forming a capacitance insulating layer so as to cover said inner wall of said at least one of said first recessed portions and an inner wall of said third recessed portion, and forming a gate insulating layer so as to cover an inner wall of said second recessed portion; and forming an upper electrode in said at least one of said first recessed portions and said third recessed portion, so as to cover said capacitance insulating layer and to fill said at least one of said first recessed portions and said third recessed portion, and forming a gate electrode on said gate insulating layer, so as to fill said second recessed portion.

9. A semiconductor device comprising:
a first recessed portion opened on a substrate;
a second recessed portion formed outside said first recessed portion;
a third recessed portion opened inside said first recessed portion;
a capacitance insulating layer provided so as to cover said first and said third recessed portion;
an upper electrode formed on said capacitance insulating layer;
an insulating layer provided so as to cover said second recessed portion; and
a gate electrode formed on said insulating layer so as to cover said second recessed portion;
wherein said second recessed portion and said third recessed portion have generally the same bore and depth; and
said capacitance insulating layer and said upper electrode constitute a capacitor, with said substrate serving as a lower electrode.

10. The semiconductor device according to claim 9, further comprising a fourth recessed portion to serve as an isolation region, said fourth recessed portion having generally the same depth as said first recessed portion.

11. The semiconductor device according to claim 9, further comprising a plurality of fourth recessed portions, wherein said first recessed portions are located at a predetermined interval between the adjacent fourth recessed portions.

12. The semiconductor device according to claim 9, wherein said first recessed portion includes a plurality of said third recessed portions.

* * * * *